(12) United States Patent
Chen

(10) Patent No.: US 8,283,730 B2
(45) Date of Patent: Oct. 9, 2012

(54) NEGATIVE DIFFERENTIAL RESISTANCE DEVICE WITH HIGH PVCR AND FAST SWITCHING SPEED AND MEMORY USING THE SAME

(76) Inventor: Shu-Lu Chen, Palo Alto, CA (US)

( * ) Notice: Subject to any disclaimer, the term of this patent is extended or adjusted under 35 U.S.C. 154(b) by 200 days.

(21) Appl. No.: 12/472,345

(22) Filed: May 26, 2009

(65) Prior Publication Data

US 2009/0294869 A1    Dec. 3, 2009

Related U.S. Application Data

(60) Provisional application No. 61/056,415, filed on May 27, 2008.

(51) Int. Cl.
*H01L 21/70* (2006.01)
(52) U.S. Cl. ........ 257/369; 257/205; 257/511; 438/203; 438/205; 438/154; 438/199
(58) Field of Classification Search .................. 257/369, 257/371, 375, 572, 312, 316, 595, 372, 901, 257/373, 376, 203, 206, 207, 526, 533, 536, 257/539, 565, 528, 529, E21.632, 322, 355, 257/357, 358, 487, 273, 274, 342, 370, 202, 257/204, 205, 208, 314, 173, 511; 438/153, 438/154, 199, 203, 205, 309, 313, 322
See application file for complete search history.

(56) References Cited

U.S. PATENT DOCUMENTS

| | | | | |
|---|---|---|---|---|
| 4,016,481 A | * | 4/1977 | Bradley | 323/226 |
| 4,449,205 A | * | 5/1984 | Hoffman | 365/185.08 |
| 4,855,620 A | * | 8/1989 | Duvvury et al. | 326/119 |
| 6,153,914 A | * | 11/2000 | Mulatti et al. | 257/372 |
| 7,508,701 B1 | * | 3/2009 | Liang et al. | 365/159 |

* cited by examiner

*Primary Examiner* — Ha Tran T Nguyen
*Assistant Examiner* — Thanh Y Tran
(74) *Attorney, Agent, or Firm* — Chun-Ming Shih; HDLS IPR Services

(57) ABSTRACT

A negative differential resistance (NDR) device is designed and a possible compact device implementation is presented. The NDR device includes a voltage blocker and a current blocker and exhibits high peak-to-valley current ratio (PVCR) as well as high switching speed. The corresponding process and design are completely compatible with contemporary Si CMOS technology and area efficient. A single-NDR element SRAM cell prototype with a compact size and high speed is also proposed as its application suitable for embedded memory.

20 Claims, 10 Drawing Sheets

NEGATIVE DIFFERENTIAL RESISTANCE DEVICE WITH HIGH PVCR AND FAST SWITCHING SPEED AND MEMORY USING THE SAME

CROSS REFERENCE APPLICATIONS

This application claims priority from U.S. Provisional Patent Application No. 61/056,415, filed on May 27, 2008.

BACKGROUND OF THE INVENTION

1. Field of the Invention

The present invention relates to a negative differential resistance (NDR) device and memory using the same.

2. Description of Prior Art

A negative differential resistance (NDR) device has the characteristic of negative differential resistance on its current-versus-voltage curve. Namely, the current is decreasing while the voltage is increasing. For example, resonant tunneling diode, tunneling diode, Gunn diode, resonant tunneling transistor and so on are the most common negative differential resistance devices.

NDR device has great potential in design and application of RF circuits because NDR device has the advantages of fast switching and operating in RF area (the working frequency is up to 1 GHz). Moreover, frequency multiplier, oscillator, multiple-state memory, analog/digital converter, current-and-voltage-level reference, multiple-value counter, multiple-value multiplexer, logic circuit, pulse generator have promising applications based on the NDR device.

However, previous NDR devices have three primary features hindering their application. First, the processes involved are usually not easy to control or even too complicated to be compatible with Si technology. Second, the peak-to-valley current ratio (PVCR) is usually too small, not high enough for memory applications considering both the switching speed and power consumption. Third, the value of current of those devices might depend on some sensitive factors (tunneling current, trapping effect, etc., for examples), which makes the uniformity of the fabrication becomes very critical and hard to control.

Random Access Memory (RAM) is a kind of volatile memory, which includes both Dynamic Random Access Memory (DRAM) and Static Random Access Memory (SRAM). DRAM requires periodical refresh to preserve the data while SRAM preserves data due to self-latching effect. Due to its self-latching feature, the switching speed of SRAM is fast among other semiconductor memory and is used widely nowadays. Typical SRAM is consisted of six transistors and can hold the data even after the write/read operation since the cross coupled inverters formed a negative feedback to latch the data. Although SRAM is faster than DRAM, the price is higher since it needs more area than a typical one-transistor DRAM.

Since NDR device has bi-stable feature, it can be also applied to design memory. For example, SRAM can be implemented by NDR device in prior art reference. However, the PVCR thereof is not high enough (higher standby power or slower speed), the manufacturing process is complicated and the result-in SRAM might still occupy considerable area.

SUMMARY OF THE INVENTION

Here, we proposed an NDR structure with both high PVCR and fast switching speed, with the additional features of CMOS compatibility and area efficiency.

In order to achieve the object mentioned above, the NDR device includes a first transistor including a first gate, a first input terminal and a first output terminal; and a second transistor with opposite polarity of the first transistor, and the second transistor including a second gate, a second input terminal and a second output terminal. The first input terminal and the second gate are electrically connected and are applied with substantially the same voltage. The first output terminal is electrically connected to the second input terminal. Therefore, the NDR device provides negative differential resistance between the first input terminal and the second output terminal.

According to one aspect of the invention, the voltage blocker can be an N-type MOSFET for example, which includes a first drain, a first gate and a first source. The current blocker with the opposite polarity (N/P type) of the voltage blocker can be a P-type MOSFET which includes a second drain, a second gate and a second source. Due to the complementary feature of MOSFET, the voltage blocker can also be a P-type MOSFET as long as the current blocker is an N-type MOSFET. In the former situation, the second source is electrically connected to the first source of the voltage blocker via direct contact (ex: P/N junction) or the current bridge (ex: a metal shunt). A predetermined gate voltage can also be supplied to the first gate of the voltage blocker. The first drain is electrically connected to the second gate. This proposed NDR device can provide negative differential resistance between the first drain and second drain.

Moreover, according to another aspect of the present invention, by slightly modifying the proposed NDR structure, it can become a memory device. We can do this by including an access transistor, for example, another MOSFET, whose gate connects to a word line in a typical memory design and a bit line electrically connected to one of the other two terminals, for example, drain of the access transistor. The proposed NDR device is electrically connected to, in this example, source of the access transistor. By doing similar operations as the previous SRAM or DRAM, for example, changing the voltage of bit line or word line, the read/write/hold operation can be performed. The data in this exemplary embodiment is stored as the form of voltage difference between the first drain and second drain of the NDR device.

BRIEF DESCRIPTION OF DRAWING

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

Figure 1:
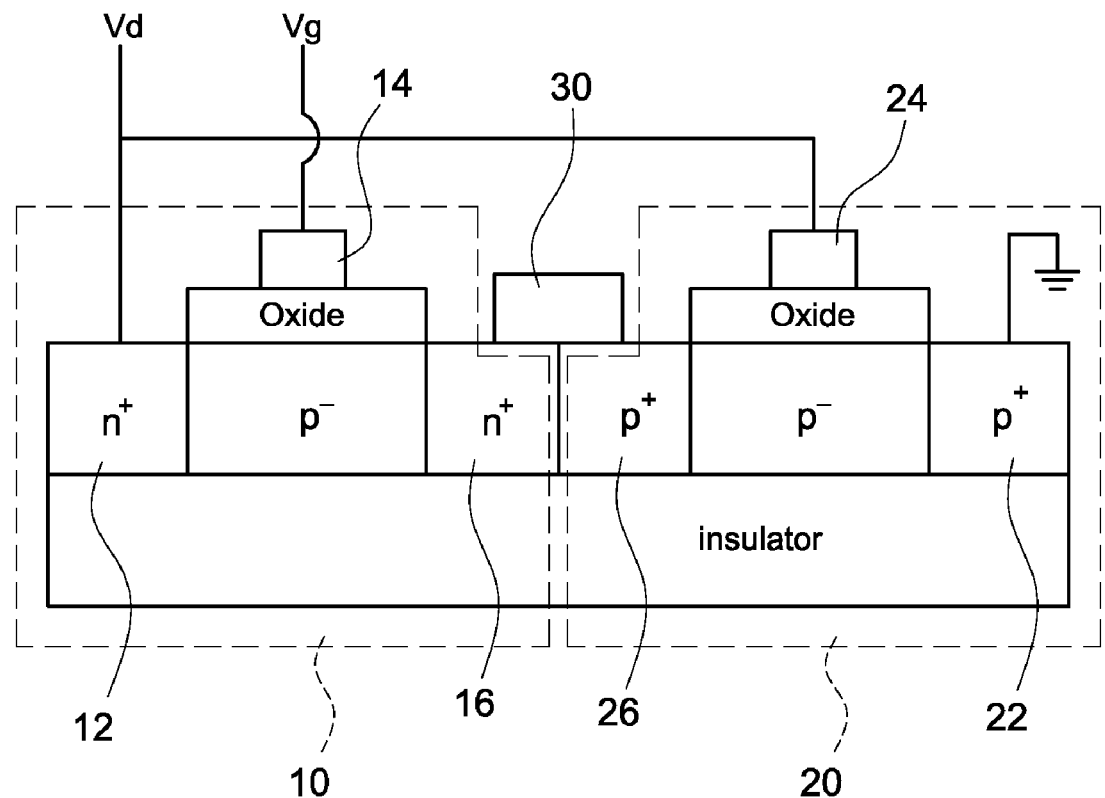
FIG. 1 is a structure diagram of NDR device according to one embodiment of present invention.
Figure 4A:
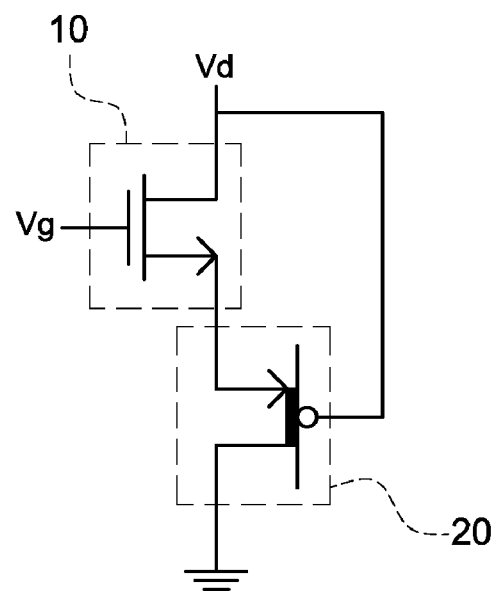
FIG. 4A is a circuit diagram of NDR device shown in FIG. 1.

Please refer to FIG. 1, which is a structure diagram of NDR device according to one embodiment of present invention. The NDR device of present invention includes a voltage blocker 10 and a current blocker 20 electrically connected to the voltage blocker 10. With reference also to FIG. 4A, in the embodiment, the voltage blocker 10 is, for example, an enhancement mode N-channel MOSFET; and the current blocker 20 is, for example, a depletion mode P-channel MOSFET. Since there is no external contact on the source region of each transistor, we can reduce the area by directly coupling the two sources as shown in FIG. 1. This source-coupled region acts as a bridge for current conduction between the two series connected transistors. In FIG. 1, a current bridge 30 is also included in the NDR device of present invention. The current bridge 30 is electrically connected to the first source 16 of the voltage blocker 10 and the second source 26 of the current blocker 20 to provide a current shunt path. Materials like silicide or metal can be used on top of this source-coupled region to provide better current conducting capability between the voltage blocker 10 and the current blocker 20 other than the band-to-band tunneling (BTBT) current intrinsically between first source 16 and second source 26. Moreover, since there is no lithography involved for this local silicide interconnect, this compact structure as shown in FIG. 1 not only simplifies the process but also has the area reduction of two contacts and isolation.

In FIG. 1, the channel doping under the gate of the voltage blocker 10 is P type. However, NMOS can also be provided by using N-type channel with gate electrode of suitable work function to switch between enhancement mode and depletion mode. Therefore, specific channel doping is not limitation for the present invention. Moreover, although the exemplary NDR device uses insulation substrate, other kinds of substrates can also be used.

The voltage blocker 10 includes a first drain 12 (first input terminal), a first gate 14 and a first source (first output terminal) 16. The current blocker 20 includes a second drain (second output terminal) 22, a second gate 24 and a second source (second input terminal) 26. The first source 16 of the voltage blocker 10 is electrically connected to the second source 26 of the current blocker 20. It should be noted above description for input and output terminal is only for exemplification and the first source 16 can also be defined as the first input terminal because the source-drain symmetric property of MOSFET. Therefore, the scope of the present invention is defined by attached claim and not by the specific exemplary example.

A predetermined voltage Vd is supplied to the first drain 12 of the voltage blocker 10 and the second gate 24 of the current blocker 20. Moreover, even in FIG. 1, the same voltage Vd is applied to the first drain 12 of the voltage blocker 10 and the second gate 24 of the current blocker 20, the NDR device according to the present invention still works when substantially the same voltage is applied to the first drain 12 of the voltage blocker 10 and the second gate 24 of the current blocker 20. Namely, the voltages applied to the first drain 12 of the voltage blocker 10 and the second gate 24 of the current blocker 20 can have slight difference. A gate voltage Vg is supplied to the first gate 14 of the voltage blocker 10. The second drain 22 of the current blocker 20 is electrically connected to ground. Here, the exact voltage of Vg can be tuned depends on the usage of the NDR device as well as the channel doping of the voltage blocker.

The operation of the NDR device of present invention will be described in more detail with reference to the I-V curve shown in FIG. 2 and FIG. 3.

Figure 2:
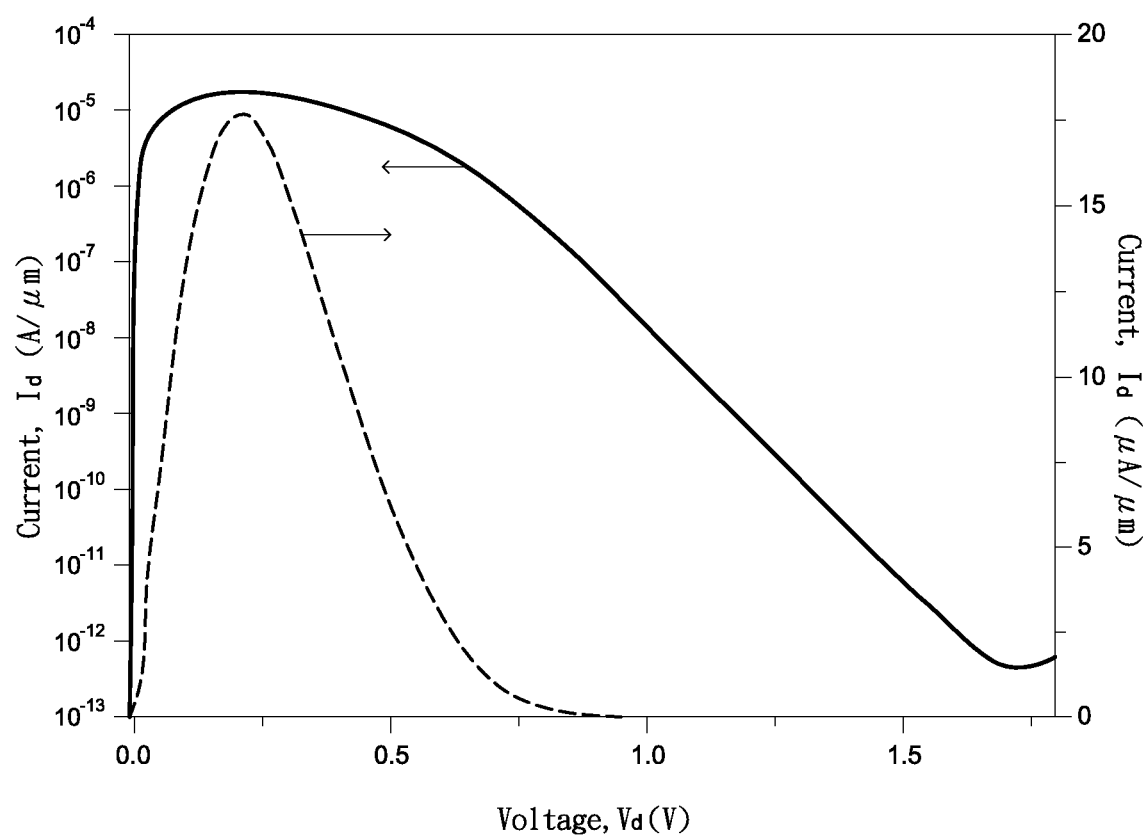
FIG. 2 is an I-V curve for NDR device according to the present invention, where solid line indicates current in log scale and dashed line indicates current in linear scale.

Please first refer to FIG. 2, which shows I-V curve for the NDR device of present invention. Please also refer to FIG. 1, at first, the gate voltage Vg is supplied to provide driving voltage for the voltage blocker 10. The DC voltage Vd is supplied to provide driving voltage for the second gate of the current blocker 20 and the first drain 12 of the voltage blocker 10. When the DC voltage Vd increases from zero, the I-V curve rises in rapid and proportional fashion, because both of the voltage blocker 10 and the current blocker 20 are turned on.

Afterwards, the DC voltage Vd increases and two situations occur. First, the voltage blocker 10 will be in saturation region. That means, even if the voltage Vd increases, the conducting current is almost the same (so the voltage blocker 10 has voltage blocking function). Second, the voltage Vd increment will cause the channel of the current blocker 20 to be narrower and eventually turned off so that the conducting current decreases (so the current blocker 20 has current blocking function). The NDR device of present invention will manifest the characteristic of negative differential resistance. Namely, the corresponding current is decreasing while the voltage is increasing.

In FIG. 1, essentially, this NDR device could also be viewed as a gate-modulated "reverse-biased" PNPN structure (or PN structure when the NMOS is turned on) and hence is immune to the usual latch-up issues associated with "forward-biased" PNPN structures as some previous device. Moreover, even though the NDR device is exemplified with MOSFET in FIG. 1, those skilled in the art can replace MOSFET with other transistors such as JFET and BJT as long as the transistor are biased to provide voltage blocker function and current block function. The JFET has the same node notation as MOSFET and the modification is straightforward. For BJT, the NMOS 10 and PMOS 20 can be replaced by BJT transistors of different polarities, respectively.

Figure 3:
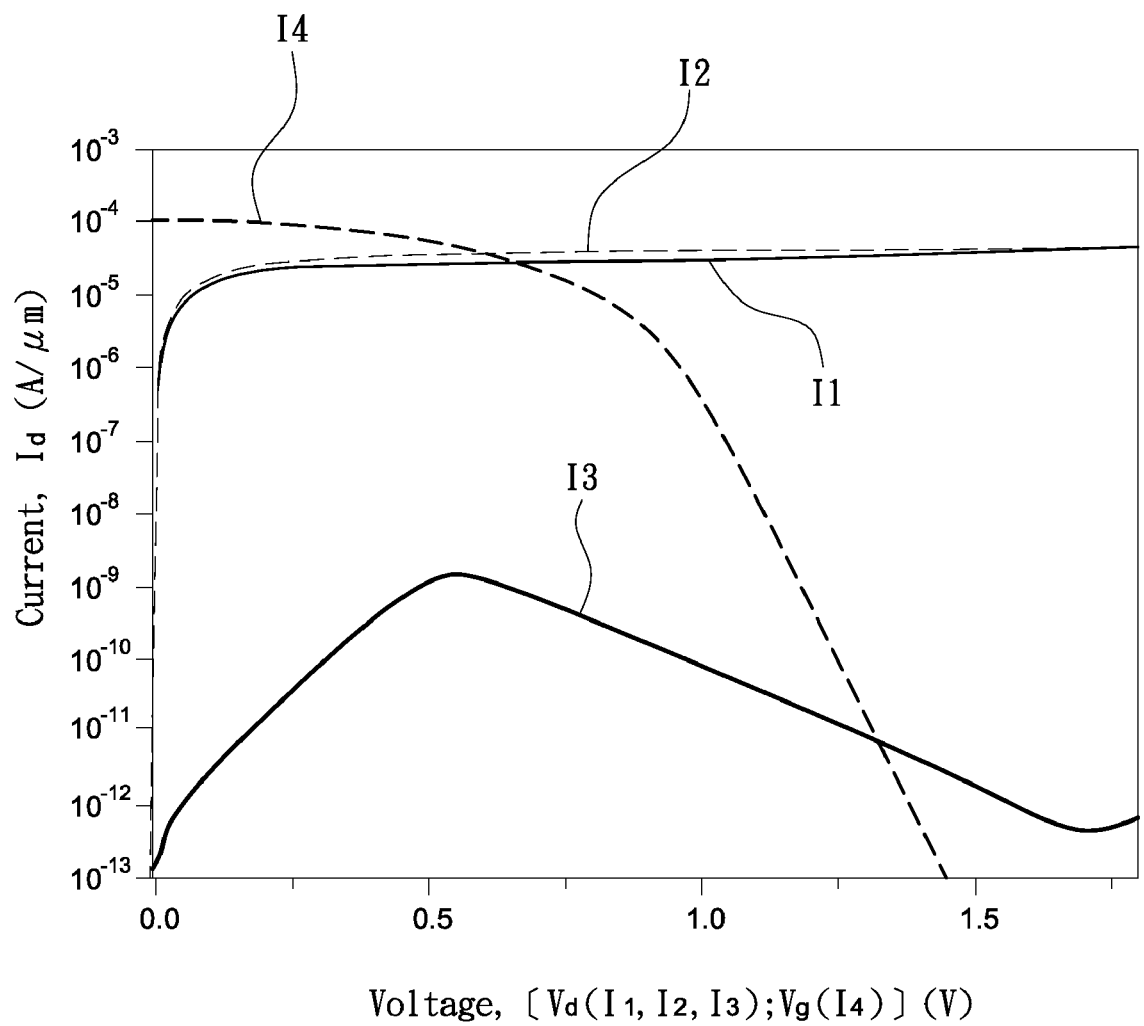
FIG. 3 is an I-V curve illustrating the operation of the present NDR device invention.
Figure 10A:
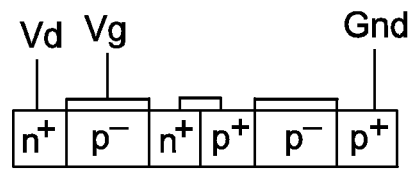
FIGS. 10A to 10D are device structure corresponding to curves I1-I4 in FIG. 3.
Figure 10B:
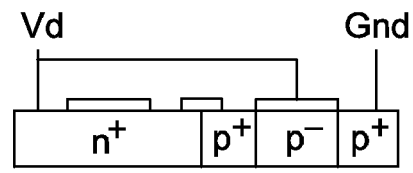
Figure 10C:
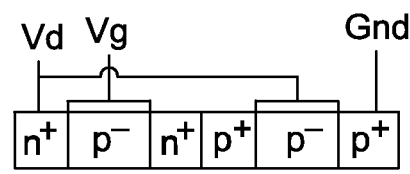
Figure 10D:
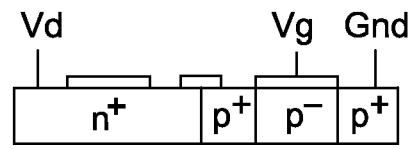

Please now refer to FIG. 3 and also to FIGS. 10A-10D, which show corresponding device structures. Conceptually, the operation principle of this NDR structure can be viewed as two transistors with their own switching behaviors but triggered in a unique sequence by single input. By cross-coupling the drain voltage of the NMOS 10 in FIG. 1 with the gate voltage of the PMOS 20 in FIG. 1, a competition between the "$I_d$-$V_d$ turn on" behavior of the NMOS and the "$I_d$-$V_g$ turn off" behavior of the PMOS is produced. In addition, the source-coupled region "decouples" the voltage change from the sweeping voltage ($V_d$) to the source side of PMOS 20 but still allows current to flow. To illustrate the origin of the NDR characteristic, the I-V curve of each isolated component is shown in FIG. 3 with the reduced device structure for each curve in the FIGS. 10A-10D. First, without the turn-off mechanism from the PMOS (current blocker 20), the I-V curve simply becomes "$I_d$-$V_d$" plot as shown in FIG. 3 "$I_1$" with the device structure in FIG. 10A. Second, without the "voltage blocker", the structure essentially becomes an $n^+$ region connected directly to the source and also cross-coupled to the gate of the PMOS. The increasing $V_d$ cannot be screened by the source-coupled region and this results in a direct current injection. Although the PMOS gate bias is increasing, this transistor cannot be turned off since its source voltage is also increasing, which makes the "$V_{gs}$" of the PMOS still larger than its threshold voltage ($V_t^{Dep}$). In other words, the field-modulated turn-off mechanism by the depletion mode transistor becomes inefficient at turning off the current since the direct current injection wins over the indirect gate modulation through an oxide. As a result, the current saturates as shown in FIG. 3 "$I_2$" with the device structure in FIG. 10B. Next, "$I_3$" with the device structure in FIG. 10C shows the $I_d$-$V_d$ curve without the silicide or metal shunt. Namely the current is conducting only through the reverse-biased P-N junction. Unlike the previous two cases, here the NDR behavior is still preserved but with a smaller peak current limited by the BTBT current. As a result, the voltage blocker 10 and current blocker 20 are essential for the proper NDR operation while the addition of current bridge improves the performance. Finally, the "$I_d$-$V_g$" plot for the depletion mode PMOS is shown in FIG. 3 "$I_4$" with the device structure in FIG. 10D to demonstrate the turn-off behavior once the source is pinned around 0.6V in this example. Conceptually, the resulting NDR behavior in FIG. 2 can be viewed as the combination of these individual components although we can not directly superimpose them. However, FIG. 3 confirms that the functions for individual components, such as voltage blocker, current bridge and current blocker, of the proposed NDR structure.

Furthermore, since $V_g$ is dc-biased to turn on the NMOS, the NDR behavior hence depends on the $V_g$ and this can be used to distinguish the "state of the device". First, when this structure is at the state with low $V_d$, a further increase in $V_g$ does not change the current since the current is limited by the applied $V_d$. However, if the structure is conducting the valley current at the high $V_d$ biasing state, an increase in $V_g$ turns on the NMOS by reforming the channel, and the pinned potential of the source-coupled region is released. As a result, the current starts to flow and this case is similar in "$I_2$" of FIG. 3. In this way, pulsing up the gate voltage of the NMOS can provide the information on which state the NDR structure is in. On the other hand, we can also decrease $V_g$ to turn off the NMOS while it's not being operated to further reduce the steady state leakage current of this NDR element.

Figure 4B:
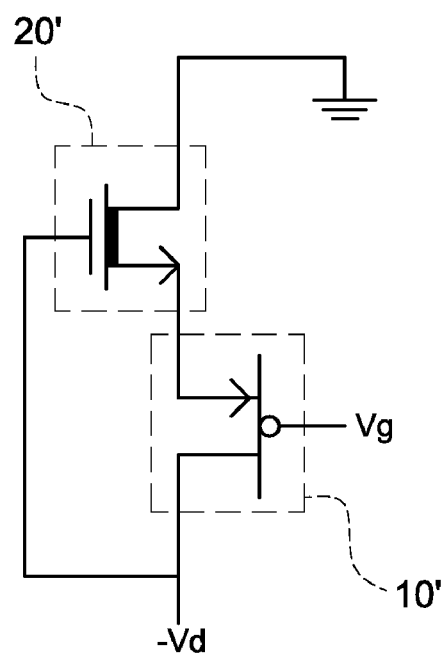
FIG. 4B is a circuit diagram of NDR device according to another embodiment of present invention.

While FIG. 4A shows the equivalent circuit of FIG. 1, FIG. 4B is the circuit diagram of NDR device according to another embodiment of present invention. The NDR device includes a voltage blocker 10' and a current blocker 20'. In this embodiment, the voltage blocker 10' is an enhancement mode PMOS. The current blocker 20' is a depletion mode NMOS. A DC voltage –Vd is supplied to the drain of the voltage blocker 10' and the gate of the current blocker 20', respectively. The source of the voltage blocker 10' is electrically connected to the source of the current blocker 20'. The drain of the current blocker 20' is electrically connected to ground.

Figure 5:
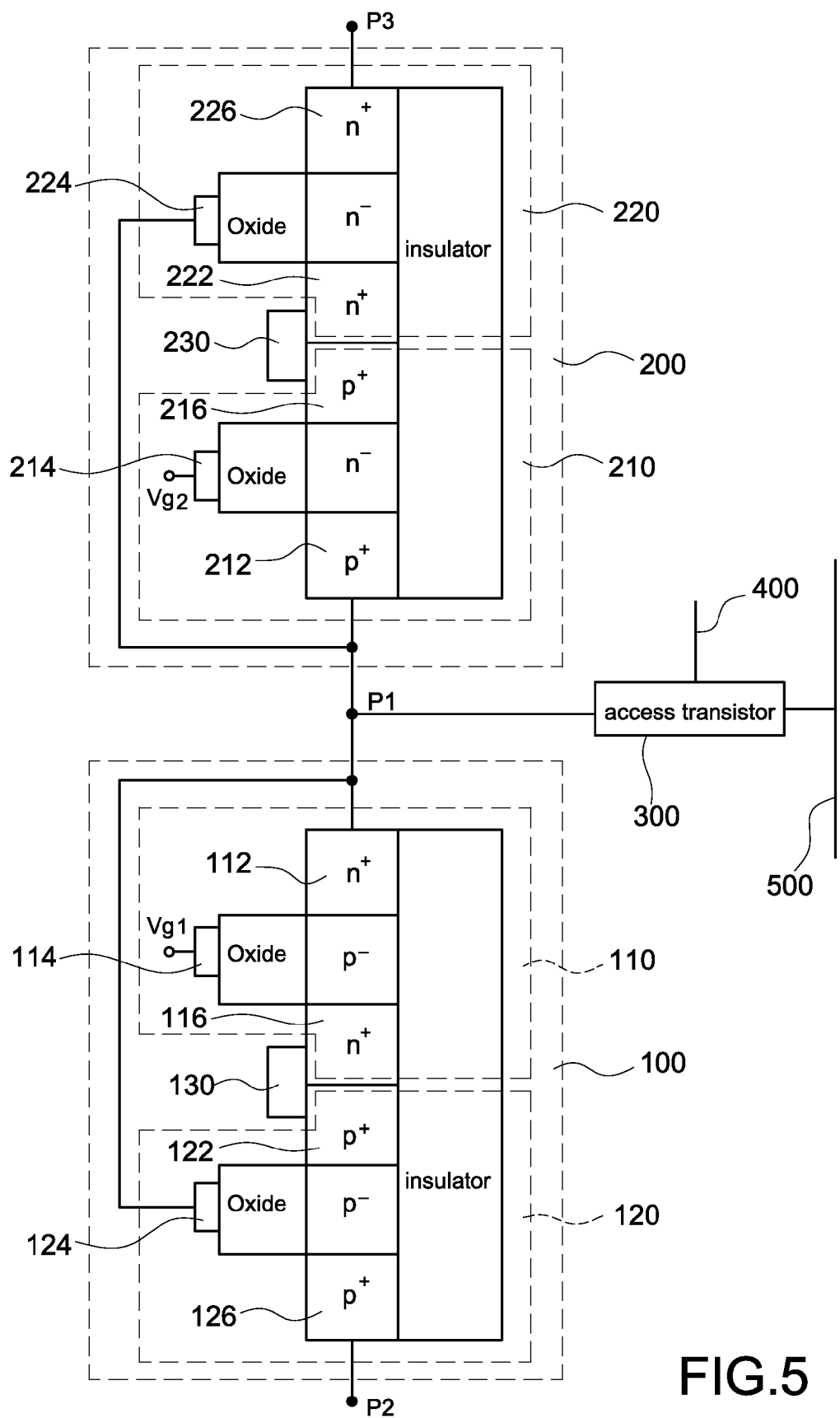
FIG. 5 is a structure diagram of NDR memory according to one embodiment of the present invention.

Please refer to FIG. 5, which is a structure diagram of an NDR memory according to one embodiment of the present invention.

Figure 7:
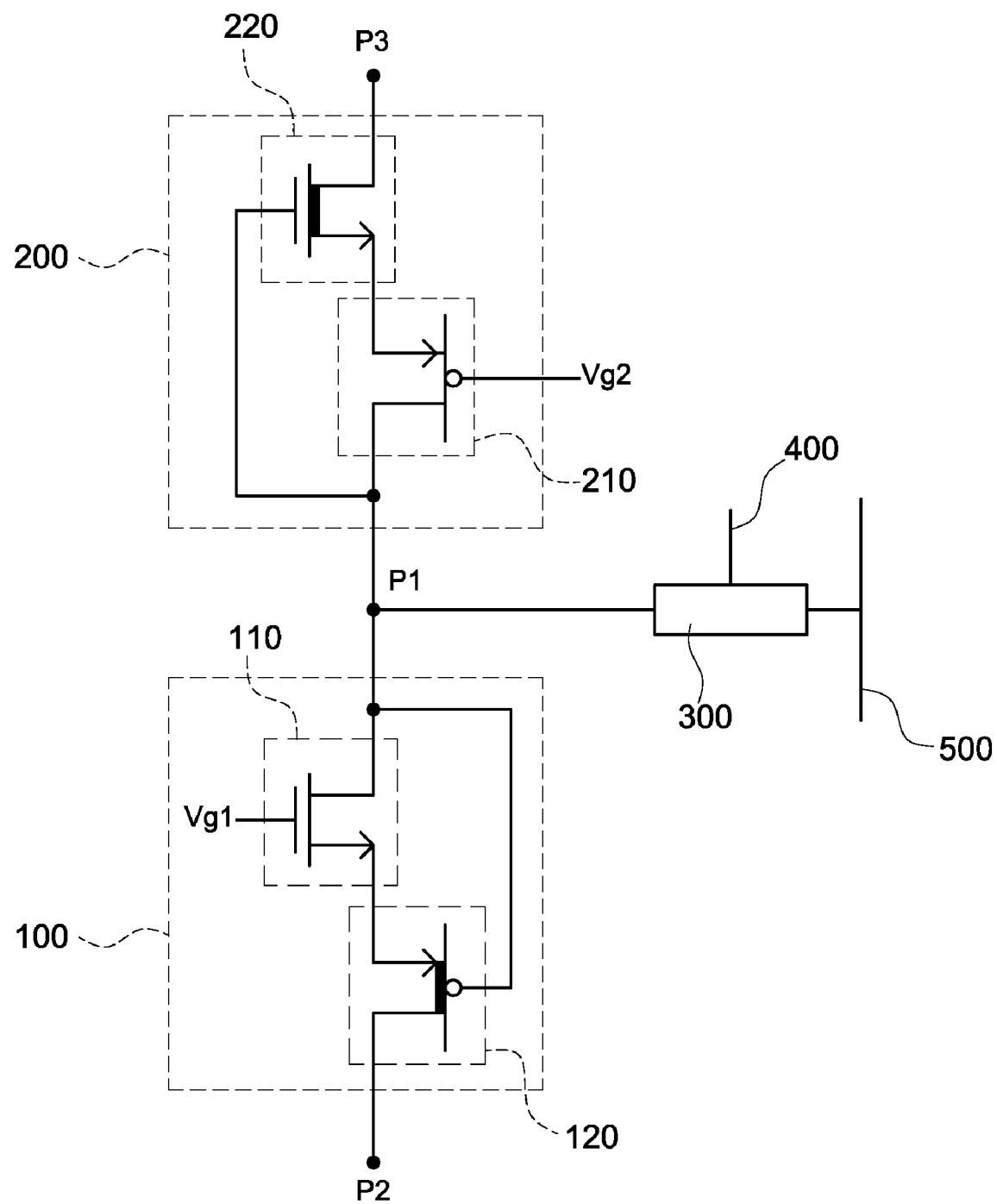
FIG. 7 is a circuit diagram of the NDR device shown in FIG. 5.

Please refer to FIG. 7, which is a circuit diagram of the NDR device for the embodiment shown in FIG. 5. In this embodiment, the NDR memory is mainly composed of two NDR devices. The NDR memory of present invention includes an access transistor 300, a word line 400, a bit line 500, a first NDR device 100 and a second NDR device 200.

The first NDR device 100 includes a first voltage blocker 110 realized by an enhancement mode NMOS and a first current blocker 120 realized by a depletion mode PMOS. The second NDR device 200 includes a second voltage blocker 210 realized by an enhancement mode PMOS and a second current blocker 220 realized by a depletion mode NMOS. The channel doping under the gate of the voltage blocker 110 is, for example, P type.

The first voltage blocker 110 includes a fifth drain 112, a fifth gate 114 and a fifth source 116. The first current blocker 120 includes a sixth drain 126, a sixth gate 124 and a sixth source 122. The second voltage blocker 210 includes a third drain 212, a third gate 214 and a third source 216. The second current blocker 220 includes a fourth drain 226, a fourth gate 224 and a fourth source 222.

The access transistor 300 is electrically connected to the word line 400 and the bit line 500. The access transistor 300 is electrically connected to the fifth drain 112, the sixth gate 124, the third drain 212, and the fourth gate 224 through a first point P1. A first gate voltage Vg1 is supplied to the fifth gate 114. A second gate voltage Vg2 is supplied to the third gate 214. The fifth source 116 is electrically connected to the sixth source 122. A first current bridge 130 is electrically connected to the fifth source 116 and the sixth source 122 to provide a current shunt path. The third source 216 is electrically connected to the fourth source 222. A second current bridge 230 is electrically connected to the third source 216 and the fourth source 222 to provide current shunt path.

The first current bridge 130 and the second current bridge 230 are composed of metal silicide or metal. The sixth drain 126 is electrically connected to a second point P2, where the potential of the second point P2 is smaller than the potential of the first point P1. The fourth drain 226 is electrically connected to a third point P3, where the potential of the third point P3 is larger than the potential of the first point P1.

This NDR pair (the first NDR device 100 and the second NDR device 200 shown in FIG. 5) looks and functions like a pair of cross-coupled inverters, however, there are two main differences. First, as stated before, the area is less than the cross-coupled inverters since there is no contact between them and only a self-aligned silicide (Salicide) process or metal shunt is needed. Second, this structure is "single-ended" instead of the "double-ended" nature of the cross-coupled inverters structure. That is, the storage node is at the symmetric point P1 of the structure and there is no "dummy cell" needed when performing the data retrieve.

Figure 8:
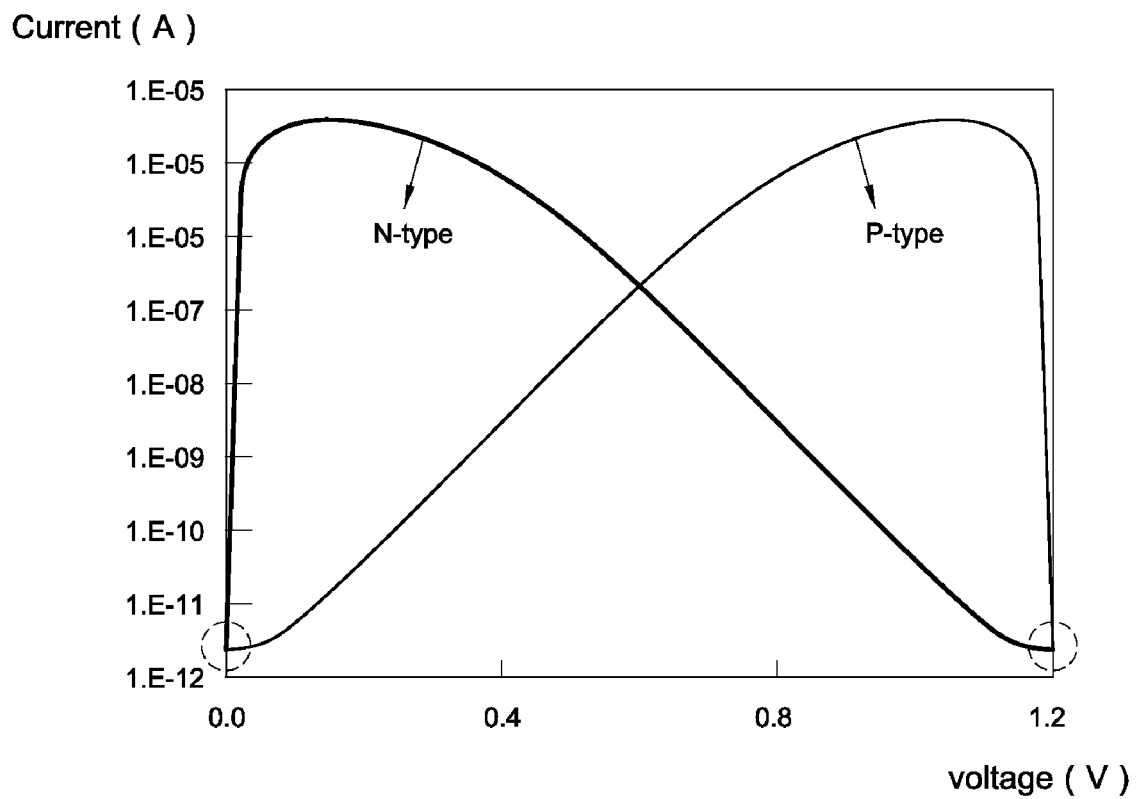
FIG. 8 is an I-V curve for NDR memory according to FIG. 5.

Please refer to FIG. 8, which shows I-V curve for the NDR memory of present invention. More particularly, N-type curve is for the first NDR device 100 while P-type curve is for the second NDR device 200. The stable operation point of the NDR memory is the points which the two NDR devices 100 and 200 have the same absolute-value current. Therefore, after the data is written, the logic 0 data or the logic 1 data is stored in the NDR memory (indicated by the dashed-line circle shown in FIG. 8). Moreover, as shown in FIG. 8, the voltage value for the point with equal current value for the two characteristic curves can be used for bias point when data is to be read from the NDR memory of present invention.

With reference to the circuit connection shown in FIG. 7 and the characteristic curves shown in FIG. 8, the NDR memory of the present invention will manifest memory characteristic. The NDR memory of the present invention has Si CMOS compatible manufacturing process, high PVCR and reduced area.

Figure 6A:
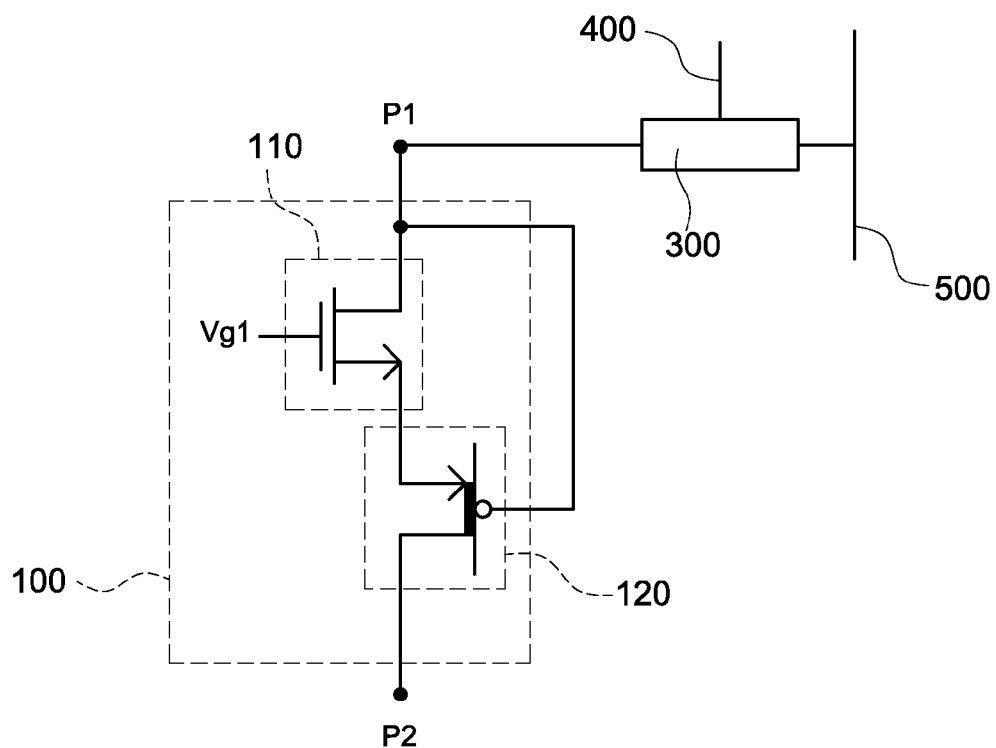
FIG. 6A is a circuit diagram of NDR memory according to another embodiment of the present invention.
Figure 6B:
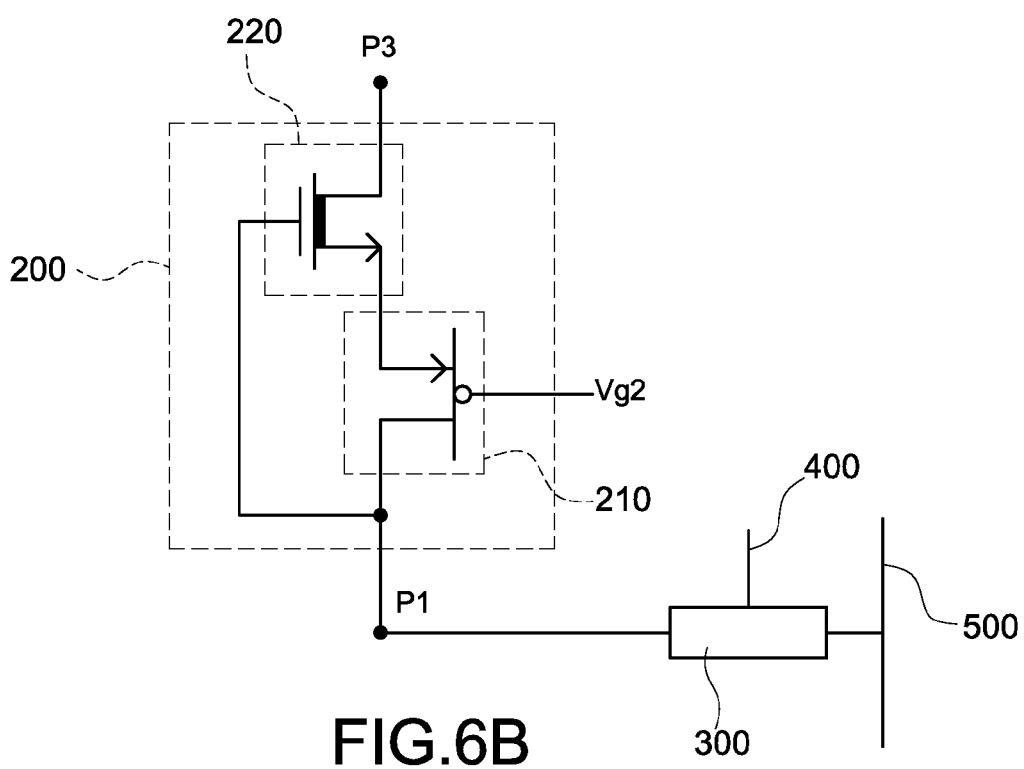
FIG. 6B is a circuit diagram of NDR memory according to still another embodiment of the present invention.

Please refer to FIGS. 6A and 6B, which show the circuit diagrams of an NDR memory according to another embodiments of the present invention, where only one NDR device (first NDR device 100 or the second NDR device 200) is used to implement the memory function. More particularly, the embodiment shown in FIG. 6A is exemplified with the first NDR device 100 and the embodiment shown in FIG. 6B is exemplified with the second NDR device 200. In this case, the first logic data can be sustained by the NDR structure while the second logic data can be sustain by the leakage current of access transistor 300.

Figure 9:
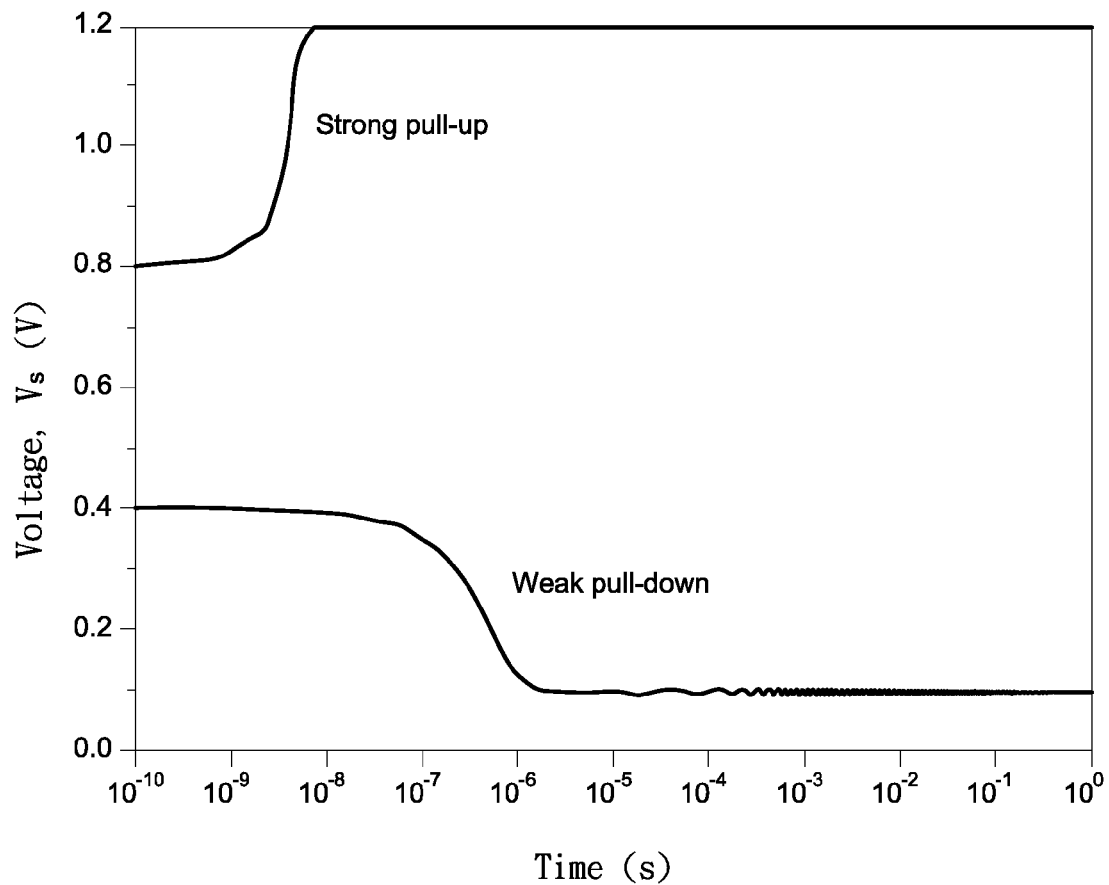
FIG. 9 is the Voltage-time plot showing the memory behavior according to FIG. 6B.

To further illustrate the operation of this proposed single-NDR memory in FIGS. 6A and 6B, here we choose the second NDR device 200 from FIG. 6B as the example, assuming the holding mode bit line voltage is at ground. In the holding mode, the current flowing from P3 through the second NDR device 200 to P1 is used to maintain the "high" state while the leakage current flowing from P1 through the access transistor 300 to bit line 500 is used to maintain the "low" state. When P1 deviates from the "high" state, usually Vdd, the data is restored by a large charging current from P3 to P1 through the second NDR device 200, while at P1~0V ("low" state, usually ground), the requirement that the leakage current of the access transistor 300 is greater than the valley current of the second NDR device 200 must be met to maintain the static low state. Although other high PVCR material based NDR structures could also be used in this architecture, the low state leakage requirement is hard to meet since the process for fabricating and controlling the features of the memory element is different from that of the logic device and the current components are more sensitive to process and environment change. We can then design the access transistor 300 with a leakage current larger than the leakage current of the second NDR device 200 to maintain the stable "low" state. To demonstrate its data retention feature, please refer to FIG. 9, where Vs means the voltage of P1. As expected, when the stored voltage is deviated from the two stable points less than Vdd/2, the "high" state restoration can be done very fast but the "low" state restoration is much slower due to the small leakage current available from the access transistor 300. However, both states are static and need no refresh.

Additionally, this structure can also be used in another scheme: choosing the access transistor 300 with a smaller leakage current but applying a "universal refresh". The universal refresh can be conducted by peripheral circuit for the memory device shown in FIG. 6B through following two approaches, respectively. First, the peripheral circuit refreshes storage data by changing a predetermined voltage of the node of the transistor 300, which is electrically connected to the bit line 500, for a predetermined period. Second, the peripheral circuit refreshes storage data by changing a predetermined voltage of the gate voltage of the transistor 300 for a predetermined period. Namely, the universal refresh is performed by either slightly activating the word line 400 or pulling down the holding voltage of the bit line 500 in the previous example. By doing this, the access transistor 300 is partially turned-on and the leakage current increases to restore the "low" state cells while those cells in the "high" state attached to the same bit line 500 are still maintained by the high peak current of the attached NDR element. This "universal refresh" is very different from the conventional DRAM cell operation whose refresh operation is done by reading each cell individually since it is essentially a "read and write-back" operation. Here this "universal refresh" is applied for whole blocks at one time and only those cells storing the "low" state will react and be restored.

Moreover, the power consumption of the single-NDR memory in FIGS. 6A and 6B can be reduced by changing a predetermined voltage of the gate voltage (Vg1 or Vg2) for a predetermined period with peripheral circuit when the NDR device is not activated.

To demonstrate the key features and advantages by using a circuit based approach, we proposed a single-NDR based SRAM prototype that combines both features of the existing DRAM and SRAM. Essentially, by adding the NDR element as the active charging component, the DRAM cell becomes a SRAM cell. This SRAM cell operates like a DRAM cell but there are three main differences. First of all, it is static and needs no individual refresh since the data retention issue is solved by the NDR element. Besides, the access transistor needs no special design for high threshold voltage (low-leakage) purpose which also partially limits the available current and speed of the conventional DRAM. In other words, the data storage and data access are partially decoupled in this proposed memory cell. The NDR element is mainly used for data storage while the data access is mostly through the peripheral circuit which can provide larger current drive and higher speed. As a result, this memory prototype can be operated at high speed with approximately half the area of the conventional six-transistor SRAM.

Although the present invention has been described with reference to the preferred embodiment thereof, it will be understood that the invention is not limited to the details thereof. Various substitutions and modifications have been suggested in the foregoing description, and others will occur to those of ordinary skill in the art. For example, the MOSFET in those embodiments can be any other transistor including JFET which performs the same logic function. The choice of substrate, choice of doping type and the choice of enhancement or depletion mode can also be applied to those of ordinary skill in this art.

What is claimed is:
1. A negative differential resistance (NDR) device including:
   a first transistor including a first gate, a first input terminal and a first output terminal; and
   a second transistor with opposite polarity of said first transistor so that if the first transistor is an N type field effect transistor (FET), the second transistor has to be a P type FET, and if the first transistor is a P type FET, the second transistor has to be an N type FET, and said second transistor including a second gate, a second input terminal and a second output terminal;
   wherein said first input terminal and said second gate are electrically connected and substantially the same voltage is supplied to said first input terminal and said second gate;
   wherein said first output terminal is electrically connected to said second input terminal;
   wherein said NDR device provides a negative differential resistance behavior of a conducting current level decreasing while a voltage difference increases between said first input terminal and said second output terminal when a changeable input voltage is applied between the first input terminal and the second output terminal.
2. The NDR device of claim 1, wherein a predetermined voltage is supplied to said first gate to form a conducting channel between the first input terminal and the first output terminal for the negative differential resistance behavior between the first input terminal and the second output terminal.
3. The NDR device of claim 1, wherein said first transistor and said second transistor are contiguous, without isolation between the region of said first output terminal and the region of said second input terminal.
4. The NDR device of claim 3, further including a current bridge composed of metal or metal compound to provide an electrical connection between said first output terminal and said second input terminal.

5. The NDR device of claim 1, wherein said first transistor is an enhancement mode FET and said second transistor is a depletion mode FET.

6. The NDR device of claim 5, wherein said first transistor and said second transistor are contiguous, without isolation between the region of said first output terminal and the region of said second input terminal.

7. The NDR device of claim 6, further including a current bridge composed of metal or metal compound to provide an electrical connection between said first output terminal and said second input terminal.

8. The NDR device of claim 1, wherein
when the first transistor is an N type FET, a voltage applied to the first input terminal is higher than a voltage applied to the second output terminal to provide the negative differential resistance behavior between said first input terminal and said second output terminal; and
when the first transistor is a P type FET, the voltage applied to the first input terminal is lower than the voltage applied to the second output terminal to provide the negative differential resistance behavior between said first input terminal and said second output terminal.

9. The NDR device of claim 1, wherein said first output terminal is substantially short-circuited to said second input terminal to be directly coupled with each other.

10. A negative differential resistance (NDR) memory device including:
a first transistor including a first gate, a first input terminal and a first output terminal; and
a second transistor with opposite polarity of said first transistor so that if the first transistor is an N type field effect transistor (FET), the second transistor has to be a P type FET, and if the first transistor is a P type FET, the second transistor has to be an N type FET, and said second transistor including a second gate, a second input terminal and a second output terminal;
wherein said first input terminal and said second gate are electrically connected and substantially the same voltage are supplied to said first input terminal and said second gate;
wherein said first output terminal is electrically connected to said second input terminal;
wherein a negative differential resistance behavior of a conducting current level decreasing while a voltage difference increases is provided between the first input terminal and the second output terminal when a changeable input voltage is applied between the first input terminal and the second output terminal;
a third transistor including a third gate, a third input terminal and a third output terminal;
wherein said first input terminal is electrically connected to said third output terminal;
whereby said NDR memory device provide data storage mechanism with small area and fast access speed.

11. The NDR memory device of claim 10, wherein a predetermined voltage is supplied to the first gate to form a conducting channel between the first input terminal and the first output terminal for the negative differential resistance behavior between the first input terminal and the second output terminal.

12. The NDR memory device of claim 10, wherein the first and the second transistor are contiguous, without isolation between the region of said first output terminal and the region of said second input terminal.

13. The NDR memory device of claim 12, further including a current bridge composed of metal or metal compound to provide an electrical connection between said first output terminal and said second input terminal.

14. The NDR memory device of claim 10, wherein said first transistor is an enhancement mode FET and said second transistor is a depletion mode FET.

15. The NDR memory device of claim 14, wherein said first transistor and said second transistor are contiguous, without isolation between the region of said first output terminal and the region of said second input terminal.

16. The NDR memory device of claim 15, further including a current bridge composed of metal or metal compound to provide an electrical connection between said first output terminal and said second input terminal.

17. The NDR memory device of claim 10, wherein a predetermined voltage of said third input is changed for a predetermined period for refreshing storage data.

18. The NDR memory device of claim 10, wherein a predetermined voltage of said third gate is changed for a predetermined period for refreshing storage data.

19. The NDR memory device of claim 10, wherein a predetermined voltage of said first gate is changed for a predetermined period for reducing power consumption.

20. The NDR device of claim 10, wherein said first output terminal is substantially short-circuited to said second input terminal to be directly coupled with each other.

* * * * *